US008384214B2

(12) United States Patent
Wu et al.

(10) Patent No.: US 8,384,214 B2
(45) Date of Patent: Feb. 26, 2013

(54) SEMICONDUCTOR STRUCTURE, PAD STRUCTURE AND PROTECTION STRUCTURE

(75) Inventors: Hui-Min Wu, Hsinchu County (TW); Bang-Chiang Lan, Taipei (TW); Ming-I Wang, Taipei County (TW); Tzung-I Su, Yun-Lin County (TW); Chien-Hsin Huang, Taichung (TW); Chao-An Su, Kaohsiung County (TW); Tzung-Han Tan, Taipei (TW); Min Chen, Taipei County (TW); Meng-Jia Lin, Changhua County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 12/577,734

(22) Filed: Oct. 13, 2009

(65) Prior Publication Data

US 2011/0084394 A1    Apr. 14, 2011

(51) Int. Cl.
H01L 31/00 (2006.01)
H01L 23/02 (2006.01)
H01L 23/48 (2006.01)
H01L 23/52 (2006.01)
H01L 29/40 (2006.01)

(52) U.S. Cl. ........ 257/734; 257/459; 257/688; 257/758; 257/774; 257/786; 257/E23.02

(58) Field of Classification Search .......... 257/459, 257/688, 758, 774, 786, E23.02, 734
See application file for complete search history.

(56) References Cited

U.S. PATENT DOCUMENTS

| | | | | |
|---|---|---|---|---|
| 6,150,725 A * | 11/2000 | Misawa et al. | | 257/781 |
| 6,444,544 B1 * | 9/2002 | Hu et al. | | 438/467 |
| 6,667,552 B1 * | 12/2003 | Buynoski | | 257/758 |
| 6,943,448 B2 * | 9/2005 | Gabriel et al. | | 257/758 |
| 7,482,675 B2 * | 1/2009 | Adkisson et al. | | 257/620 |
| 7,601,629 B2 * | 10/2009 | Ramappa et al. | | 438/619 |
| 2002/0045297 A1 * | 4/2002 | Leedy | | 438/149 |
| 2002/0047207 A1 * | 4/2002 | Sekiguchi | | 257/758 |
| 2002/0047218 A1 * | 4/2002 | Liu et al. | | 257/786 |
| 2002/0105046 A1 * | 8/2002 | Matsumoto et al. | | 257/471 |
| 2004/0164418 A1 * | 8/2004 | Sugiura et al. | | 257/758 |
| 2004/0169280 A1 * | 9/2004 | Farber et al. | | 257/758 |
| 2004/0180524 A1 * | 9/2004 | Rodgers et al. | | 438/597 |
| 2005/0003670 A1 * | 1/2005 | Yamada et al. | | 438/692 |
| 2005/0082577 A1 * | 4/2005 | Usui | | 257/211 |
| 2005/0173806 A1 * | 8/2005 | Matsubara | | 257/774 |
| 2005/0194651 A1 * | 9/2005 | Ohashi | | 257/415 |
| 2005/0239273 A1 * | 10/2005 | Yang | | 438/601 |
| 2006/0141792 A1 * | 6/2006 | Ohashi et al. | | 438/692 |
| 2007/0141829 A1 * | 6/2007 | Ramappa et al. | | 438/619 |
| 2007/0170591 A1 * | 7/2007 | Yamanoue et al. | | 257/758 |
| 2007/0222037 A1 * | 9/2007 | Wu | | 257/620 |
| 2008/0233736 A1 * | 9/2008 | Ohashi et al. | | 438/633 |
| 2008/0246152 A1 * | 10/2008 | Liu et al. | | 257/758 |
| 2008/0299739 A1 * | 12/2008 | Yoshizawa et al. | | 438/424 |
| 2009/0050940 A1 * | 2/2009 | Hayashi et al. | | 257/203 |
| 2009/0243004 A1 | 10/2009 | Lan | | |

* cited by examiner

*Primary Examiner* — Teresa M Arroyo
(74) *Attorney, Agent, or Firm* — Winston Hsu; Scott Margo

(57) ABSTRACT

A semiconductor structure is provided. The semiconductor structure includes a substrate, a dielectric layer, a pad structure and a protection structure. The dielectric layer is disposed on the substrate. The pad structure is disposed in the dielectric layer. The pad structure includes a plurality of first metal layers and a plurality of plugs which are electrically connected to each other vertically. There is no contact plug disposed between the pad structure and the substrate. The protection structure is disposed in the dielectric layer and encompasses the pad structure.

16 Claims, 5 Drawing Sheets

SEMICONDUCTOR STRUCTURE, PAD STRUCTURE AND PROTECTION STRUCTURE

BACKGROUND OF THE INVENTION

1. Field of the Invention

The present invention relates to a semiconductor structure, especially to a semiconductor structure including a pad structure and a protection structure.

2. Description of the Prior Art

Along with the development of technology and the improvement of the semiconductor techniques, electronic devices are widely used in modern life. Micro-electro-mechanical system (MEMS) technology is to fabricate micro mechanical devices by using conventional semiconductor technologies such as electroplating, etching such that a mechanical component in a micro-meter scale may be formed. The MEMS device may be, for example, the voltage controlling component in an ink printer, the gyroscope in a car to detect the tilt of the car, or the vibration membrane in a microphone to sense a sound. The MEMS technology which combines the fabrication process of the mechanical and the electronic devices has the advantages of low cost, high performance and high density.

At present, the MEMS is usually integrated into a chip in a form of system on chip (SOC), especially a chip fabricated by a conventional CMOS process. For instance, a MEMS region and a CMOS region may be formed on a die simultaneously. In the present fabrication method to integrate the CMOS region and the MEMS region, many problems may occur. For example, when fabricating the CMOS and the MEMS devices, the influence of fabrication methods between each region may be occurred.

Please refer to FIG. 1, illustrating a schematic diagram of a conventional MEMS region and a non-MEMS region. As shown in FIG. 1, a die 100 includes a MEMS region 104 and a non-MEMS region 102. A variety of MEMS devices 106 are fabricated in the MEMS region 104, for example, a vibration membrane or a motor. The non-MEMS region 102 includes a logic region, a memory region or a periphery circuit region and a variety of semiconductor devices are disposed therein (not shown), such as some active or inactive components. The surface of the non-MEMS region 102 includes a plurality of pads 108. The semiconductor devices in the non-MEMS region 102 or the MEMS device 106 in the MEMS region 104 can be driven by an outer signal through the pads 108 to carry out the input/output signal processing.

When fabricating the MEMS device 106, at least an etching process is provided to the die 100 after finishing all the MEMS device 106, the semiconductor devices and the metal interconnections. An etching gas such as HF, an etching solvent or other etchants is supplied to etch away the IMD layers in the MEMS region 104 and to form a variety of movable or mechanical MEMS devices 106 having 3D micro structures.

However, many problems occur during the etching process. For instance, in order to prevent the semiconductor devices in the non-MEMS region 102 from being damaged during the etching process, a mask layer (not shown) is usually provided on the non-MEMS region 102 to protect the IMD therebelow. The mask layer is usually a metal layer. However, entirely covering the conductive mask layer onto the non-MEMS region 102 will make each pad 108 electrically connect to each other and an electrical short phenomenon occurs. On the other hand, if the pad 108 is not covered by the mask layer, the etchant easily penetrates along the edge of the pad 108 and damages the devices in the non-MEMS region 102. Moreover, while the pad 108 is designed to drive the MEMS device 106 or the semiconductor device, the connection arrangement should also be taken into consideration, so as to avoid the short phenomenon or the cross talk noise.

SUMMARY OF THE INVENTION

The present invention provides a semiconductor structure which can prevent the short phenomenon between each pad and can also prevent the etchant leaking from the edge of the pad into the non-MEMS region. According to the embodiments provided in the present invention, the pad structure can provide good electrical connection property when connecting to the semiconductor device or the MEMS device.

According to the claimed invention, a semiconductor structure is provided. The semiconductor structure includes a substrate, a dielectric layer, a pad structure and a protection structure. The dielectric layer is disposed on the substrate. The pad structure is disposed in the dielectric layer. The pad structure includes a plurality of first metal layers and a plurality of plugs which are electrically connected to each other vertically. There is no contact plug disposed between the pad structure and the substrate. The protection structure disposed in the dielectric layer encompasses the pad structure.

According to the claimed invention, a semiconductor structure is further provided. The semiconductor structure includes a substrate, a dielectric layer, a pad structure, an insulation structure and a protection structure. The dielectric layer is disposed on the substrate. The pad structure is disposed in the dielectric layer. The pad structure includes a plurality of first metal layers and a plurality of plugs which are electrically connected to each other vertically. The insulation structure is disposed between the substrate and the pad structure. The protection structure disposed in the dielectric layer encompasses the pad structure.

According to the claimed invention, a semiconductor structure is further provided. The semiconductor structure includes a substrate, a dielectric layer, a pad structure and a protection structure. The dielectric layer is disposed on the substrate. The pad structure is disposed in the dielectric layer. The pad structure includes a plurality of first metal layers and a plurality of plugs which are electrically connected to each other vertically. At least one of the cross area of the first metal layers is different from those of the other first metal layers. The protection structure disposed in the dielectric layer encompasses the pad structure.

The protection structure can prevent the etchant from flowing into the non-MEMS region and damaging the devices therein. The pad structure can connect to semiconductor devices or MEMS devices for signal input/output. The pad structure is insulated from the substrate, providing good electrical connection property.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
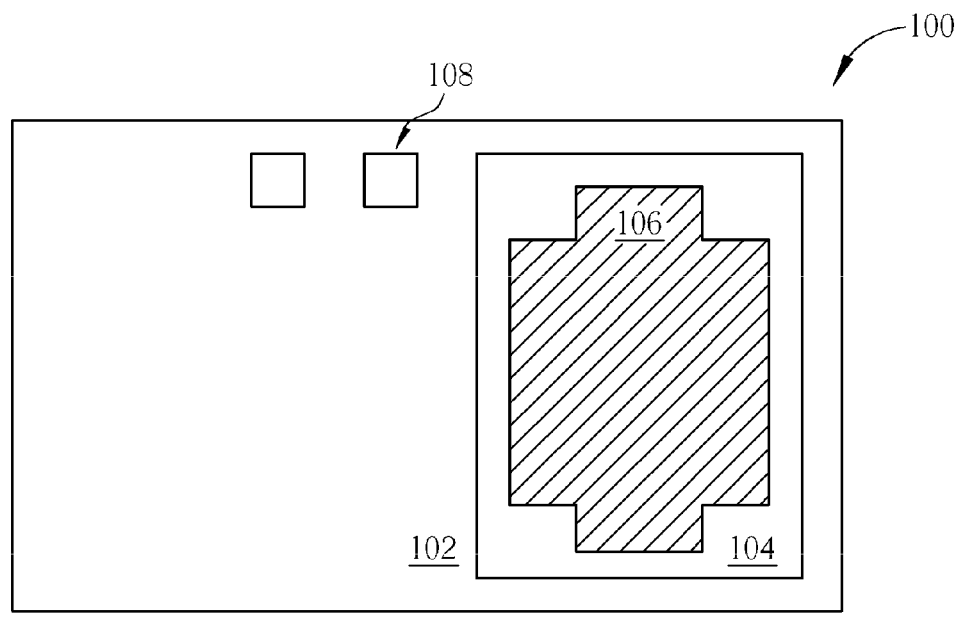
FIG. 1 illustrates a schematic diagram of a conventional MEMS region and a non-MEMS region.
Figure 2:
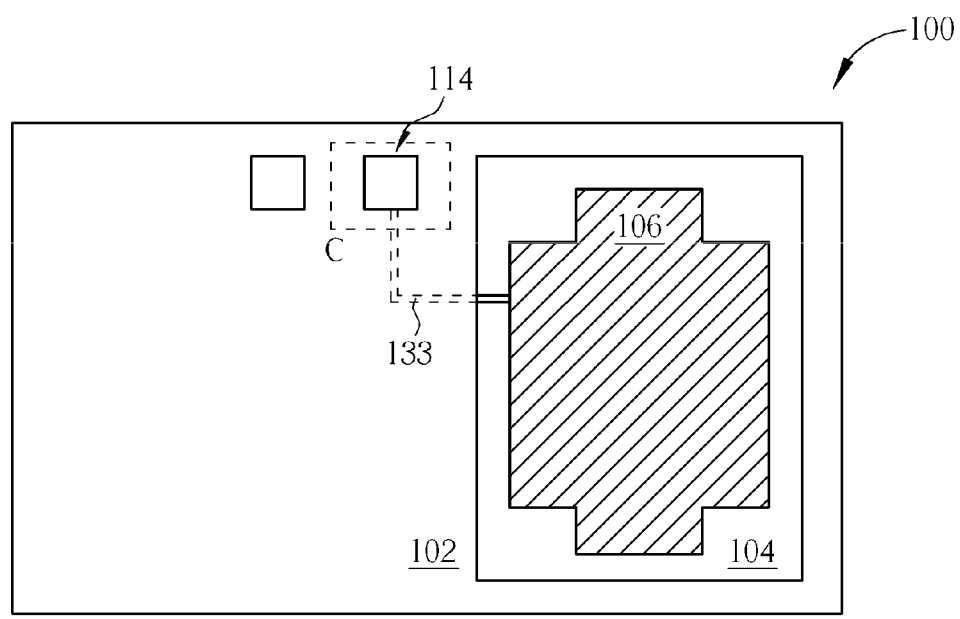
FIG. 2 illustrates a schematic diagram of a MEMS region and a non-MEMS region in the present invention.

Please refer to FIG. 2, illustrating a schematic diagram of a MEMS region and a non-MEMS region in the present invention. For the convenience of description, the same numerals in FIG. 1 are used. As shown in FIG. 2, a die 100 includes a MEMS region 104 and a non-MEMS region 102. A variety of MEMS devices 106 are fabricated in the MEMS region 104, for example, a vibration membrane or a motor. The non-MEMS region 102 includes a logic region, a memory region or a periphery circuit region and a variety of semiconductor devices are disposed therein (not shown), such as some active or inactive components. The surface of the non-MEMS region 102 includes a plurality of pad structure 114. The semiconductor devices in the non-MEMS region 102 or the MEMS device 106 in the MEMS region 104 can be driven by an outer signal through the pad structure 114 to carry out the input/output signal processing.

Figure 3:
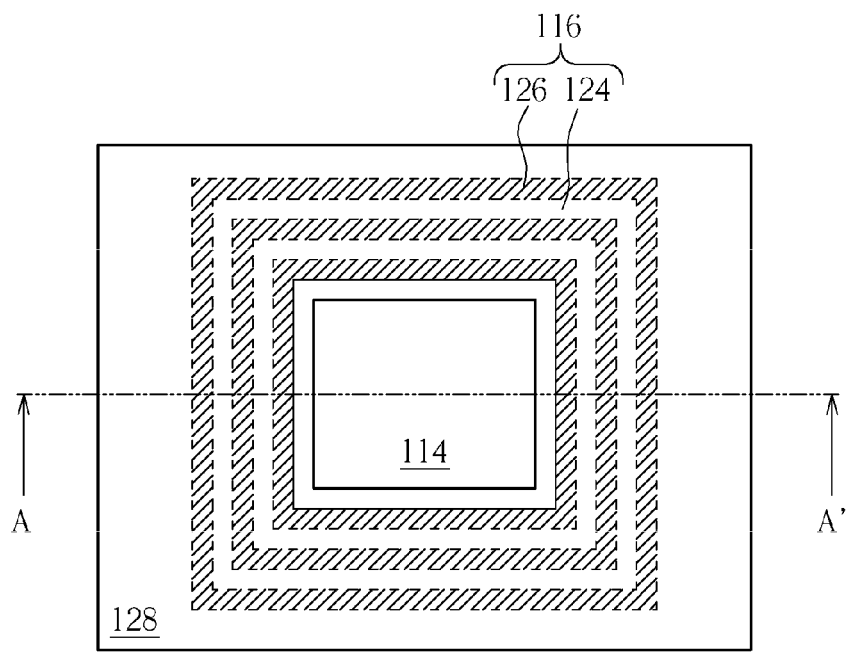
FIG. 3 is a top view schematic diagram of the semiconductor structure in the present invention.
Figure 4:
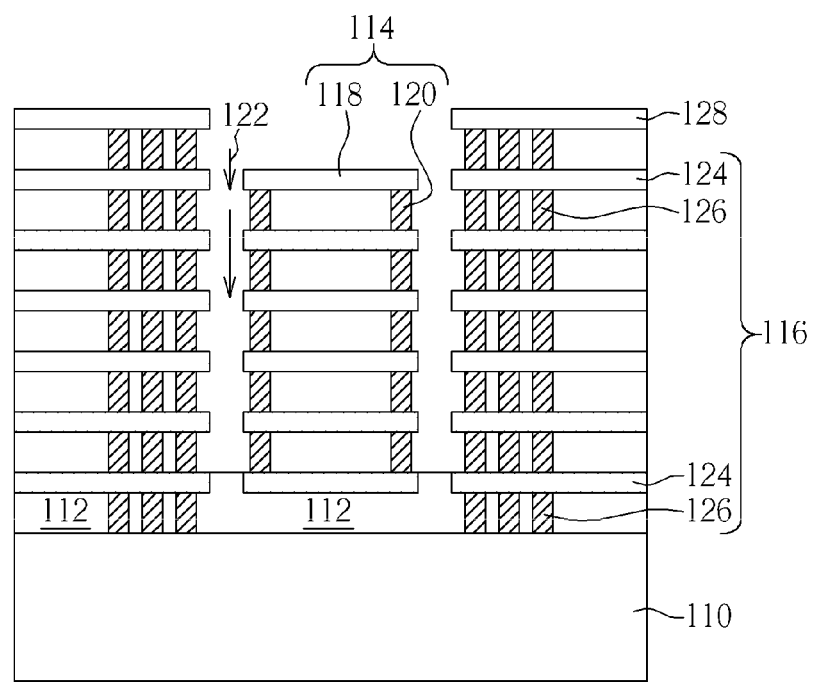
FIG. 4 to FIG. 7 illustrate schematic diagrams of the embodiments of the semiconductor structure in the present invention.

Please refer to FIG. 3 and FIG. 4. FIG. 3 is a top view schematic diagram of the semiconductor structure in the present invention. FIG. 3 shows an enlarged area according to the area C in FIG. 2. FIG. 4 is a cross sectional diagram according to the AA' line as shown in FIG. 3. The semiconductor structure in the present invention includes a substrate 110, a dielectric layer 112, a pad structure 114, a protection structure 116 and a mask layer 128. As shown in FIG. 3, the pad structure 114 is disposed in the non-MEMS region 102, wherein a wire bonding may be formed thereon. Outer signal can drive the semiconductor device (not shown) or the MEMS device 106 through the pad structure 114.

The mask layer 128 in the present invention covers the non-MEMS region 102 but does not cover the pad structure 114, thus the short phenomenon in conventional arts between the mask layer 128 and the pad structure 114 can be avoided. Moreover, to prevent the etchant 122 from penetrating into the non-MEMS region 102 along the edge of the pad structure 114, the protection structure 116 encompassing the pad structure 114 is provided.

For the detailed description, please refer to FIG. 4. The pad structure 114 and the protection structure 116 are both disposed in the dielectric layer 112 on the substrate 110. The material of the dielectric layer 112 includes $SiO_2$, TEOS, PETEOS or other suitable IMD materials.

As shown in FIG. 4, the pad structure 114 includes a plurality of first metal layers 118 and a plurality of plugs 120. Each first metal layer 118 is interlaced with the dielectric layer 112 and is connected to each other by the plugs 120, forming a stack structure. That is, each first metal layer 118 includes a lamination structure and each plug 120 is disposed therebetween. The embodiment of each plug 120 may be independent vias, independent barriers, or a patterned layout with different vias and barriers. The embodiment of each plug 120 between different first metal layers 118 (that is, plugs 120 located in different layers) may be or may not be the same. The principle is that the plugs 120 should be able to support and stabilize the pad structure 114. In the preferred embodiment of the present invention, each plug 120 forms a closed ring structure and encompasses the dielectric layer 112 between each of the first metal layer 118. Accordingly, when supplying the etchant 122 such as HF, the dielectric layer 112 in the pad structure 114 is not removed and each plug 120 can connect and support the first metal layer 118 vertically, leading to a stable structure. The first metal layers 118 and the plugs 120 include a variety of conductive materials, such as tungsten, copper of aluminum, so each first metal layer 118 and each plug 120 are electrically connected to each other.

In order to prevent the dielectric layer 112 from being removed by the etchant 122 during the etching process, leading to damages to the semiconductor devices in the non-MEMS region 102, the semiconductor structure in the present invention further includes the protection structure 116 and the mask layer 128. The mask layer 128 is disposed on the dielectric layer 112, covering the non-MEMS region 102 and exposing the pad structure 112 and the MEMS region 104. The mask layer 128 includes anti-etch materials. For example, when the etchant 122 is HF, the mask layer 128 may preferably be aluminum. The protection structure 116 is disposed around the pad structure 114, that is, the protection structure 116 encompasses the pad structure 114. The protection structure 116 upwardly contacts the mask layer 128 and downwardly contacts the substrate 110, forming an intact anti-etching structure vertically. In detail, the protection structure 116 includes a plurality of second metal layers 124 and a plurality of protection rings 126. Each second metal layer 124 includes a lamination structure and each protection ring 126 is disposed therebetween. The protection ring 126 has a continuous ring structure which includes tungsten, aluminum, amorphous silicon, silicon nitride or other anti-etching materials. In one embodiment, only one protection ring 126 is provided between each two adjacent second metal layer 124, but in another embodiment, a plurality of protection ring 126 may also be available. Each of the protection ring 126 is disposed parallel to each other and encompasses the pad structure 114. The layout of the protection ring 126 may be a closed shape such as a polygon, a circular. FIG. 3 shows a square, but the shape of the protection ring 126 should not limited thereto. The shape of the protection ring 126 in the same layer or in different layers may be the same or may not be the same. The principle is that the protection ring 126 should encompass the pad structure 114 and essentially contact the second metal layer 124 vertically.

When the pad structure 114 and the protection structure 116 are both made of metal, the same metallization process may be carried out to form the pad structure 114 and the protection structure 116. For example, when forming the first metal layer 118 of the pad structure 114, the second metal layer 124 of the protection structure 116 in the same layer may be formed simultaneously. Next, when forming the plug 120 of the pad structure 114, the protection ring 126 of the protection structure 116 in the same layer may be formed simultaneously. Accordingly, if the lay-out arrangement of the metal layers and plugs is well adjusted, the semiconductor structure of the present invention can be achieved by using conventional metal interconnection manufacture process such as: aluminum fabrication process, via plug fabrication process or Cu damascene. Each process can be substantially integrated into existing semiconductor manufacture processes, thereby forming the pad structure 114 and the protection structure 116 simultaneously. It is noted that the first metal layers 118 and the plugs 120 in the pad structure 114 should be insulated from the protection structure 116 to avoid the short phenomenon. However, if the protection ring 126 of the protection structure 116 is made of insulation materials, such as silicon nitride, the pad structure 114 may contact the insulated protection ring 126, but the electrical insulation should be kept.

On the other hand, in order to avoid the current leaking through the substrate 110 when the pad structure 114 receives the input/output signal, the pad structure 114 in the present invention is insulated from the substrate 110. In one embodiment of the present invention, there is no contact plug disposed between the pad structure 114 and the substrate 110. That is, there is no contact plug or other similar structures between the substrate 110 and the lowest first metal layer 118 (usually the earliest developed metal layer, usually called Ml) to electrically connect the substrate 110 and the lowest first metal layer 118. There is only the dielectric layer 112 between the substrate 110 and the pad structure 114.

Figure 5:
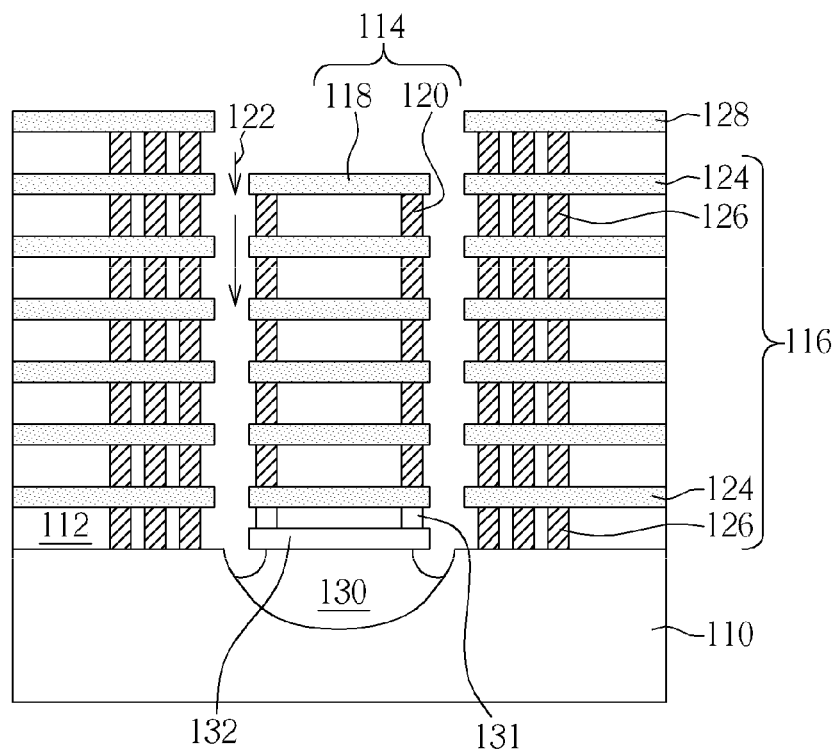

In another embodiment, the semiconductor structure can further include an insulation structure disposed between the pad structure 114 and the substrate 110. Please refer to FIG. 5, illustrating a schematic diagram of another embodiment of the semiconductor structure in the present invention. An insulation structure is disposed between the pad structure 114 and the substrate 110. The insulation structure may be, for example, a shallow trench isolation (STI) 130 or other suitable structure. STI 130 is formed by a conventional CMOS fabrication method. For instance, etching the substrate 110 to form a trench, and then filling the trench with insulation material such as silicon oxide. The pad structure 114 is disposed directly on the STI 130 and is insulated from the substrate 110 by the STI 130.

Because the STI 130 can provide good insulation property, in this embodiment, a contact plug 131 can be disposed between the pad structure 114 and the STI 130 to provide better supporting ability to the pad structure 114. As shown in FIG. 5, in the embodiment of the present invention, a material layer 132 can be disposed on the STI 130. For example, a poly silicon layer which is formed by a conventional poly silicon gate forming process can also provide good supporting ability.

Figure 6:
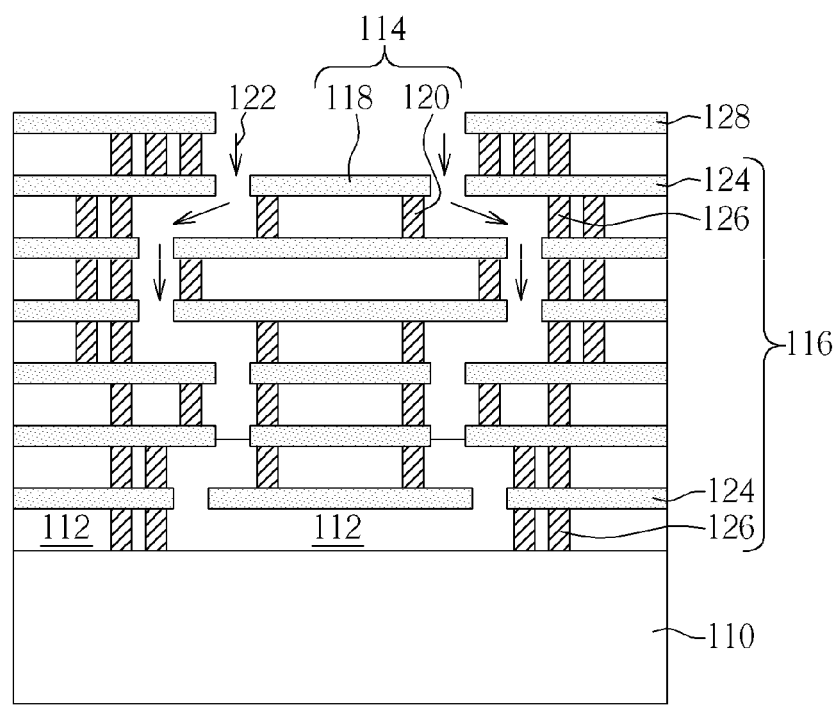
Figure 7:
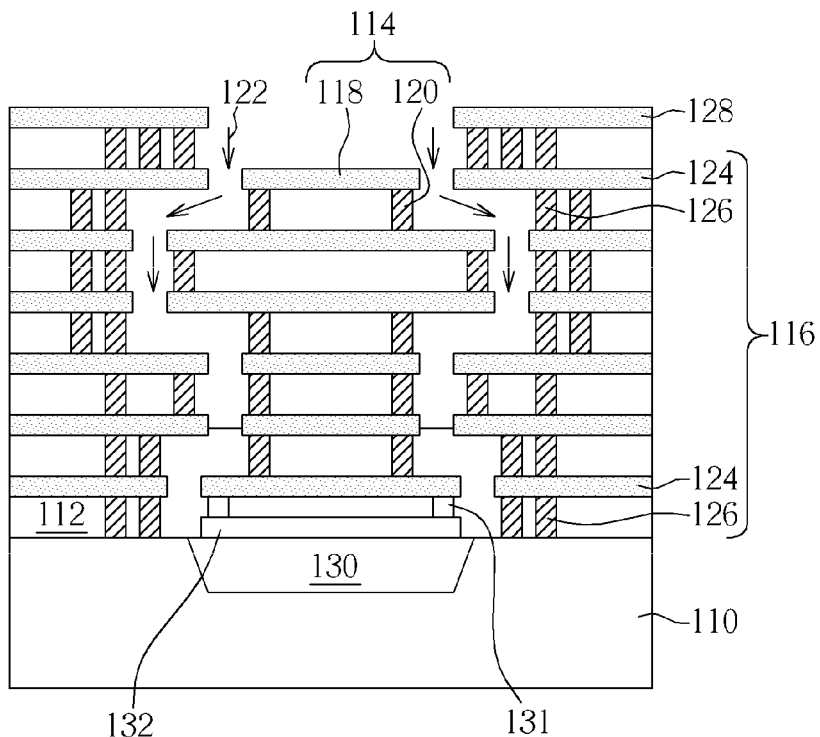

Please refer to FIG. 6, illustrating a schematic diagram of the third embodiment of the semiconductor structure in the present invention. As shown in FIG. 6, when supplying the etchant 122, the etchant 122 may flow along the gap between the pad structure 114 and the protection structure 116 and remove the dielectric layer 112 herein. To avoid the over etching of the dielectric layer 112 around or below the pad structure 114, which may result in the instability of the pad structure 114, the cross area (or the width, the length) of each first metal layer 118 may be different. As shown in FIG. 6, at least one of the cross area of the first metal layer 118 is different from those of the other first metal layers 118 in the pad structure 114. As a result, the route for the etchant 122 flowing through the gap between the pad structure 114 and the protection structure 116 may be elongated, thereby reducing the possibility that the dielectric layer 112 around or below the pad structure 114 is etched away. The widened first metal layer 118 is not limited to specific layer. The widened first metal layer 118 can be a single layer or can be multi layers which could be arranged arbitrarily. This embodiment can also be in coordination with other embodiments. For example, the semiconductor structure in the present invention may include different width of the first metal layers 118 and also include the insulation structure such as STI 130 disposed between the substrate 110 and the pad structure 114, as shown in FIG. 7.

Figure 8:
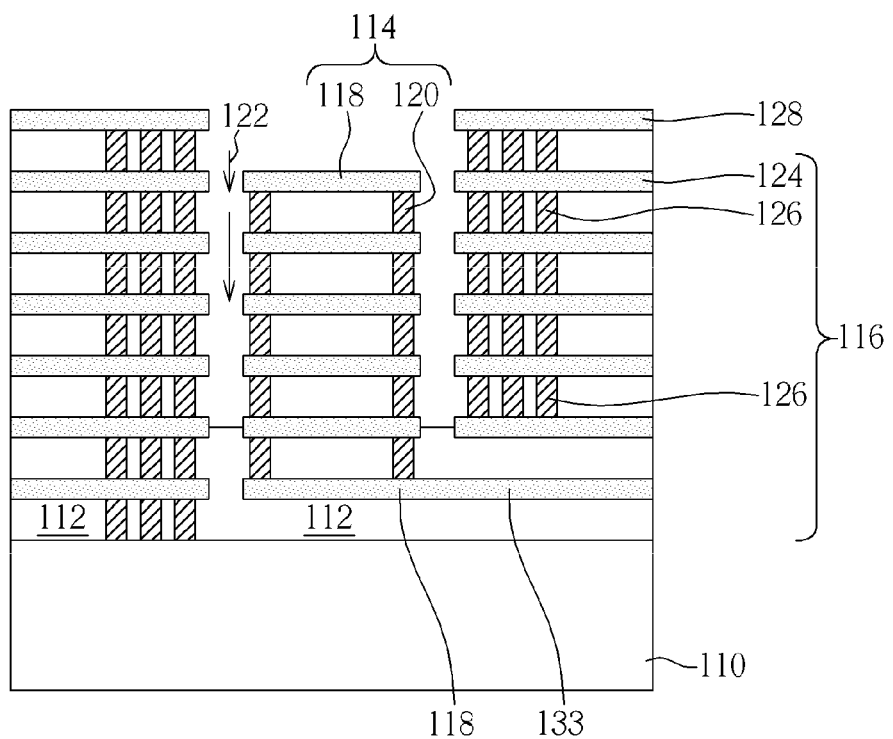
FIG. 8 and FIG. 9 illustrate schematic diagrams of the pad structure which connect outwardly.
Figure 9:
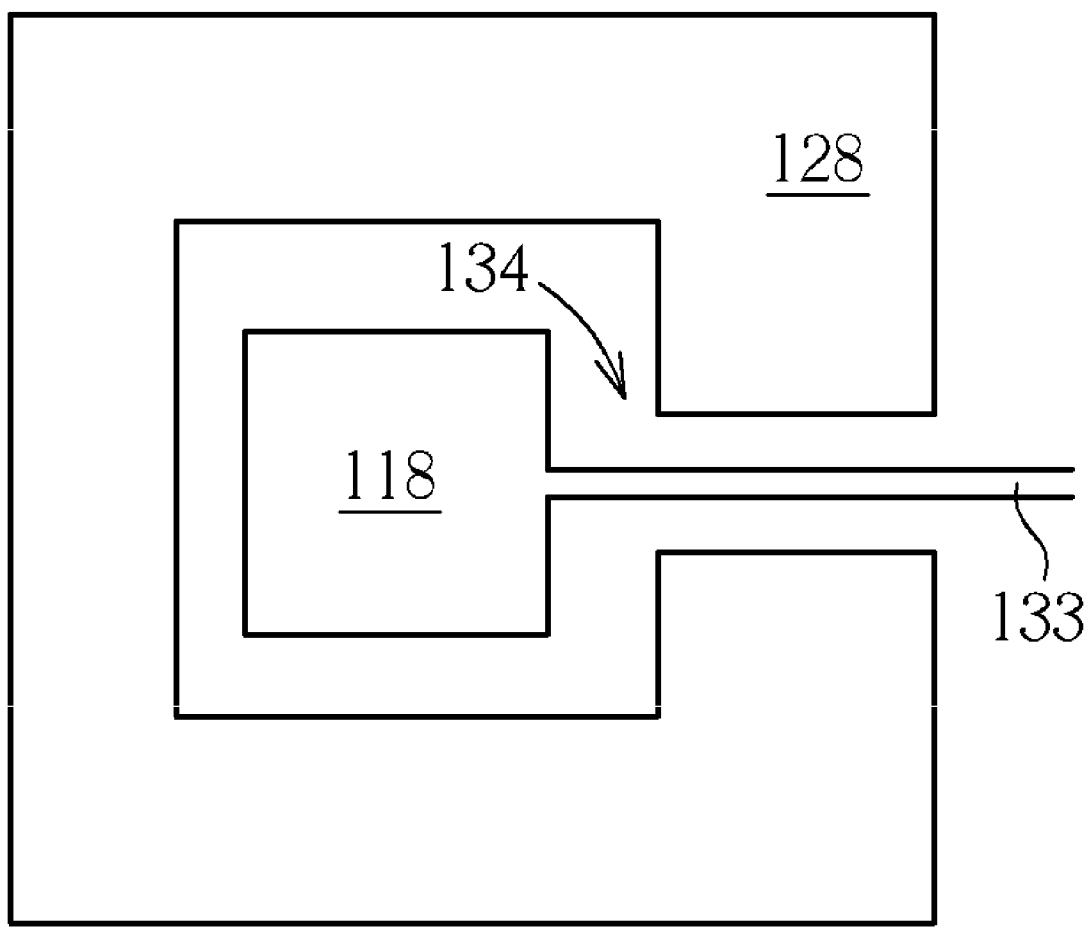

Please refer to FIG. 8, illustrating a schematic diagram of the pad structure which connects outwardly. As shown in FIG. 8, the pad structure 114 further includes a metal wire 133 to provide an electrical connection to the semiconductor device (not shown) or the MEMS device 106. The metal wire 133 can be connected to the active or passive components in the non-MEMS region 102, or, as shown in FIG. 2, the metal wire 133 can connect to the input side of the MEMS device 106, so as to drive the MEMS device 106. As described above, the pad structure 114 and the protection structure 116 should keep electrical insulation from each other. The protection structure 116 includes an opening 134 disposed corresponding to the metal wire 133 to provide a pathway for the metal wire 133. Please refer to FIG. 9, illustrating a top view schematic diagram of the metal wire and the second metal layer in the same layer. As shown in FIG. 9, the second metal layer 128 of the protection structure 116 includes an opening 134 for the metal wire 133 to pass through. Preferably, the opening 134 is disposed within the lower second metal layer 128, for example, the lowest lower second metal layer 128, to reduce the possibility for the etchant 122 to flow into the opening 134.

In light of above, the present invention provides a semiconductor structure that includes a pad structure and a protection structure. The protection structure can prevent the etchant from flowing into the non-MEMS region and damaging the devices therein. The pad structure can be connected to the semiconductor devices or the MEMS devices for signal input/output. According to the embodiments in the present invention, the pad structure is insulated from the substrate, providing good electrical connection property for the pad structure.

Those skilled in the art will readily observe that numerous modifications and alterations of the device and method may be made while retaining the teachings of the invention.

What is claimed is:

1. A semiconductor structure, comprising:
   a substrate;
   a dielectric layer disposed on the substrate;
   a pad structure disposed in the dielectric layer, the pad structure comprising a plurality of first metal layers and a plurality of plugs which electrically connect to each other vertically wherein there is no contact plug disposed between the pad structure and the substrate; and
   a protection structure disposed in the dielectric layer, wherein the protection structure encompasses the pad structure and an air gap is disposed between the pad structure and the protection structure, and a part of the dielectric layer is disposed on an area that is not encompassed by the protection structure.

2. The semiconductor structure as in claim 1, wherein the pad structure is insulated from the protection structure.

3. The semiconductor structure as in claim 1, wherein parts of the plugs form a ring structure which encompasses the dielectric layer in the pad structure.

4. The semiconductor structure as in claim 1, further comprising a metal mask layer disposed on the dielectric layer, wherein the protection structure contacts the mask layer upwardly and contacts the substrate downwardly.

5. The semiconductor structure as in claim 1, wherein the protection structure comprises a plurality of second metal layers and a plurality of protection rings which connect to each other vertically.

6. A semiconductor structure, comprising:
   a substrate;
   a dielectric layer disposed on the substrate;
   a pad structure disposed in the dielectric layer, the pad structure comprising a plurality of first metal layers and a plurality of plugs which electrically connect to each other vertically;
   an insulation structure disposed between the substrate and the pad structure, wherein the pad structure is completely surrounded by the insulation structure; and
   a protection structure disposed in the dielectric layer, wherein the protection structure encompasses the pad structure and an air gap is disposed between the pad structure and the protection structure.

7. The semiconductor structure as in claim 6, wherein the insulation structure includes a shallow trench isolation.

8. The semiconductor structure as in claim 6, further comprising a material layer disposed between the pad structure and the insulation structure, wherein the material layer includes polysilicon.

9. The semiconductor structure as in claim 6, wherein the pad structure is insulated from the protection structure.

10. The semiconductor structure as in claim 6, wherein parts of the plugs form a ring structure which encompasses the dielectric layer in the pad structure.

11. The semiconductor structure as in claim 6, further comprising a metal mask layer disposed on the dielectric layer, wherein the protection structure contacts the mask layer upwardly and contacts the substrate downwardly.

12. The semiconductor structure as in claim 6, wherein the protection structure comprises a plurality of second metal layers and a plurality of protection rings which connect to each other vertically.

13. The semiconductor structure as in claim 1, wherein at least one of the cross area of the first metal layers is different from those of the other first metal layers.

14. The semiconductor structure as in claim 1, wherein the protection structure comprises a plurality of second metal layers and a plurality of second plugs electrically connected to each other vertically, wherein at least one of the cross areas of the second metal layers is different from those of the other second metal layers.

15. The semiconductor structure as in claim 6, wherein at least one of the cross area of the first metal layers is different from those of the other first metal layers.

16. The semiconductor structure as in claim 6, wherein the protection structure comprises a plurality of second metal layers and a plurality of second plugs electrically connected to each other vertically, wherein at least one of the cross areas of the second metal layers is different from those of the other second metal layers.

* * * * *